(12) United States Patent
Tsukude

(10) Patent No.: US 6,456,129 B1
(45) Date of Patent: Sep. 24, 2002

(54) INTERNAL CLOCK SIGNAL GENERATOR

(75) Inventor: Masaki Tsukude, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/694,252

(22) Filed: Oct. 24, 2000

(30) Foreign Application Priority Data

Jan. 17, 2000 (JP) ........................................ 2000-007762

(51) Int. Cl.[7] ................................................. H03L 7/06
(52) U.S. Cl. ........................ 327/156; 327/158; 327/270; 327/276
(58) Field of Search .................................. 327/291, 299, 327/2, 3, 7, 9, 156, 158, 160, 161, 270, 271, 272, 273, 276, 277, 278, 279; 377/77, 78, 79

(56) References Cited

U.S. PATENT DOCUMENTS

| | | | |
|---|---|---|---|
| 4,922,141 A | * 5/1990 | Lofgren et al. | ............. 327/158 |
| 5,087,829 A | * 2/1992 | Ishibashi et al. | ............. 327/158 |
| 5,973,525 A | * 10/1999 | Fujii | ............................ 327/158 |
| 6,069,506 A | * 5/2000 | Miller, Jr. et al. | ........... 327/158 |
| 6,100,736 A | * 8/2000 | Wu et al. | ..................... 327/159 |
| 6,137,332 A | * 10/2000 | Inoue et al. | ................. 327/256 |
| 6,157,690 A | * 12/2000 | Yoneda | ....................... 375/376 |

FOREIGN PATENT DOCUMENTS

JP         63-161568        7/1988

* cited by examiner

Primary Examiner—Timothy P. Callahan
Assistant Examiner—An T. Luu
(74) Attorney, Agent, or Firm—McDermott, Will & Emery

(57) ABSTRACT

A stable internal clock signal generator capable of suppressing an oscillation caused by a fluctuation in a power source or the like. A shift register 14 stores a binary comparison result indicating whether a phase obtained by a comparison carried out through a phase comparing circuit 13 past (n+1) times is advanced or delayed, a phase control circuit 15 outputs, as a phase control signal to a phase variable circuit 12, the larger number of comparison results obtained by carrying out the comparison (n+1) times, and the phase variable circuit 12 adjusts the phase of an internal clock signal intclk based on the input phase control signal.

10 Claims, 7 Drawing Sheets

POWER ON

INTERNAL CLOCK SIGNAL GENERATOR

BACKGROUND OF THE INVENTION

1. Field of the Invention

The present invention relates to a semiconductor storage device and, more particularly, to an internal clock signal generating circuit in a clock-synchronized semiconductor storage device.

2. Description of the Prior Art

In recent years, there have been developed various clock-synchronized semiconductor storage devices comprising an internal clock signal generator for generating a clock signal corresponding to an external spec in a chip for an external clock signal extclk with an increase in a frequency. Typical examples of the internal clock signal generator include a PLL (Phase-Locked-Loop), DLL (Delay-Locked-Loop) and the like, which are generally used for clock-synchronized semiconductor devices other than the semiconductor storage device. These circuits include a phase comparing circuit for deciding whether the phase of the external clock signal extclk is coincident with that of an internal clock signal intclk.

FIG. 12 is a schematic block diagram showing an example of an internal clock signal generator in a conventional clock-synchronized semiconductor storage device.

In FIG. 12, an internal clock signal generator 100 comprises a phase variable circuit 101 and a phase comparing circuit 102. The result of comparison of the phase of the external clock signal extclk with that of the internal clock signal intclk which is obtained by the phase comparing circuit 102 is instantaneously fed back to the phase variable circuit 101.

FIG. 13 is a diagram showing an example of the phase variable circuit 101. Switches are provided between each of outputs of a plurality of buffer circuits connected forward in series and that of the phase variable circuit 101, respectively. One of the switches is turned on and closed in response to the result of the comparison obtained by the phase comparing circuit 102, and a clock signal output from the output terminal of the buffer circuit corresponding to the switch is output as the internal clock signal intclk from the output terminal of the phase variable circuit 101.

The phase variable circuit 101 turns one of the switches shown in FIG. 13 on in response to the result of the comparison obtained by the phase comparing circuit 102, and outputs, as the internal clock signal intclk, a clock signal generated by changing the phase of the input external clock signal extclk. For example, the phase variable circuit 101 generates the internal clock signal intclk having a phase delayed by one cycle for the external clock signal extclk. In this case, the phase variable circuit 101 generates the internal clock signal intclk by adjustment such that the phase of the internal clock signal intclk delayed by one cycle is matched with that of the external clock signal extclk according to the result of the comparison of the phase comparing circuit 102.

However, the method of instantaneously feeding the result of the comparison, obtained by the phase comparing circuit 102, back to the phase variable circuit 101 has the following drawbacks. More specifically, the phase comparing resolution of the phase comparing circuit 102 is reduced due to a fluctuation in a source voltage or the like, and a feedback system including the buffer circuit 103 and the phase comparing circuit 102 malfunctions to cause an oscillation when the error of the result of the comparison is shifted by the minimum step of the phase variable circuit 101 or more through the malfunction of the phase comparing circuit 102, that is, at least one of the positions of the switch to be turned on shown in FIG. 13 is shifted.

Japanese Patent Laid-Open Publication No. 63-161568 discloses a digital phase control circuit for use with a floppy disk drive device, in which the phase difference between input data and an output signal is detected, N values held in N registers are averaged and a phase is shifted according to the average value.

SUMMARY OF THE INVENTION

In order to eliminate the above-mentioned drawbacks, it is an object of the present invention to provide a stable internal clock signal generator capable of preventing an oscillation from being generated through a fluctuation in a power source or the like by averaging a predetermined number of comparison results in a phase comparing circuit and outputting the average value as a comparison result to a phase variable circuit.

In order to achieve the above-mentioned object, the present invention provides an internal clock signal generator for generating and outputting an internal clock signal constituting a clock signal, which may be used as a clock signal for every circuit component of a semiconductor storage device from an external clock signal inputted from an outside. This internal clock signal generator includes a phase comparing section for comparing phases of the external clock signal and the generated internal clock signal every predetermined cycle and outputting a binary comparison result indicating whether the phase of the internal clock signal is advanced or delayed for that of the external clock signal, a comparison result storing section for sequentially storing the binary comparison result compared by the phase comparing section and for storing a predetermined number of comparison results, a phase deciding section for deciding more comparison results as a phase state of the internal clock signal for the external clock signal in relation to each comparison result stored in the comparison result storing section, and a phase variable section for adjusting the phase of the generated internal clock signal and outputting the adjusted signal according to a result of the decision obtained by the phase deciding section every time the predetermined number of comparison results are stored in the comparison result storing section.

According to the above-mentioned structure, the phase state of the internal clock signal is decided by using the phase comparison results obtained by the comparison carried out a predetermined number of past times. Therefore, it is possible to prevent the phase comparison resolution from being reduced due to a fluctuation in a power source or the like and an oscillation from being caused by the erroneous phase comparison result.

Moreover, it is desirable that the phase deciding section should decrease the number of the comparison results to be used for deciding the phase state to decide the phase state of the internal clock signal when a phase difference between the external clock signal and the internal clock signal exceeds a predetermined value. With such structure of the phase deciding section, when the phase difference between the external clock signal and the internal clock signal is great, the speed of the phase adjustment can be increased and the internal clock signal can be stabilized in the early stage.

According to a preferred embodiment, the phase deciding section decreases the number of the comparison results to be used for deciding the phase state to decide the phase state of the internal clock signal for a predetermined period in which the phase difference between the external clock signal and the internal clock signal exceeds the predetermined value. With such a structure, it is possible to detect the state in which the phase difference between the external clock signal and the internal clock signal is great without deciding whether the phase difference between the external clock signal and the internal clock signal is increased.

According to another embodiment, the phase deciding section decreases the number of the comparison results to be used for deciding the phase state to decide the phase state of the internal clock signal for a predetermined time after a power source is turned on. Consequently, it is possible to easily detect the state in which the phase difference between the external clock signal and the internal clock signal is great without deciding whether the phase difference between the external clock signal and the internal clock signal is increased.

Moreover, it is desirable that the phase deciding section should decrease the number of the comparison results to be used for deciding the phase state to decide the phase state of the internal clock signal for a predetermined time after a return from a low consumed current operation mode to a normal operation mode in the semiconductor storage device. Consequently, it is possible to easily detect the state in which the phase difference between the external clock signal and the internal clock signal is great without deciding whether the phase difference between the external clock signal and the internal clock signal is increased.

Furthermore, the phase deciding section may decrease the number of the comparison results to be used for deciding the phase state to decide the phase state of the internal clock signal when a difference between one of comparison result numbers and the other comparison result number exceeds a predetermined number for each of the comparison results stored in the comparison result storing section. With such structure, when the phase difference between the external clock signal and the internal clock signal is great, the speed of the phase adjustment can be increased without detecting, in other circuits, a period in which the phase difference between the external clock signal and the internal clock signal is great. Thus, the internal clock signal can be stabilized in the early stage. Furthermore, the unexpected unstable state of the internal clock signal can be detected on the inside and the internal clock signal can be stabilized more quickly.

BRIEF DESCRIPTION OF THE DRAWINGS

The present invention will become readily understood from the following description of preferred embodiments thereof made with reference to the accompanying drawings, in which like parts are designated by like reference numeral and in which.

DESCRIPTION OF THE EMBODIMENTS

First Embodiment

Figure 1:
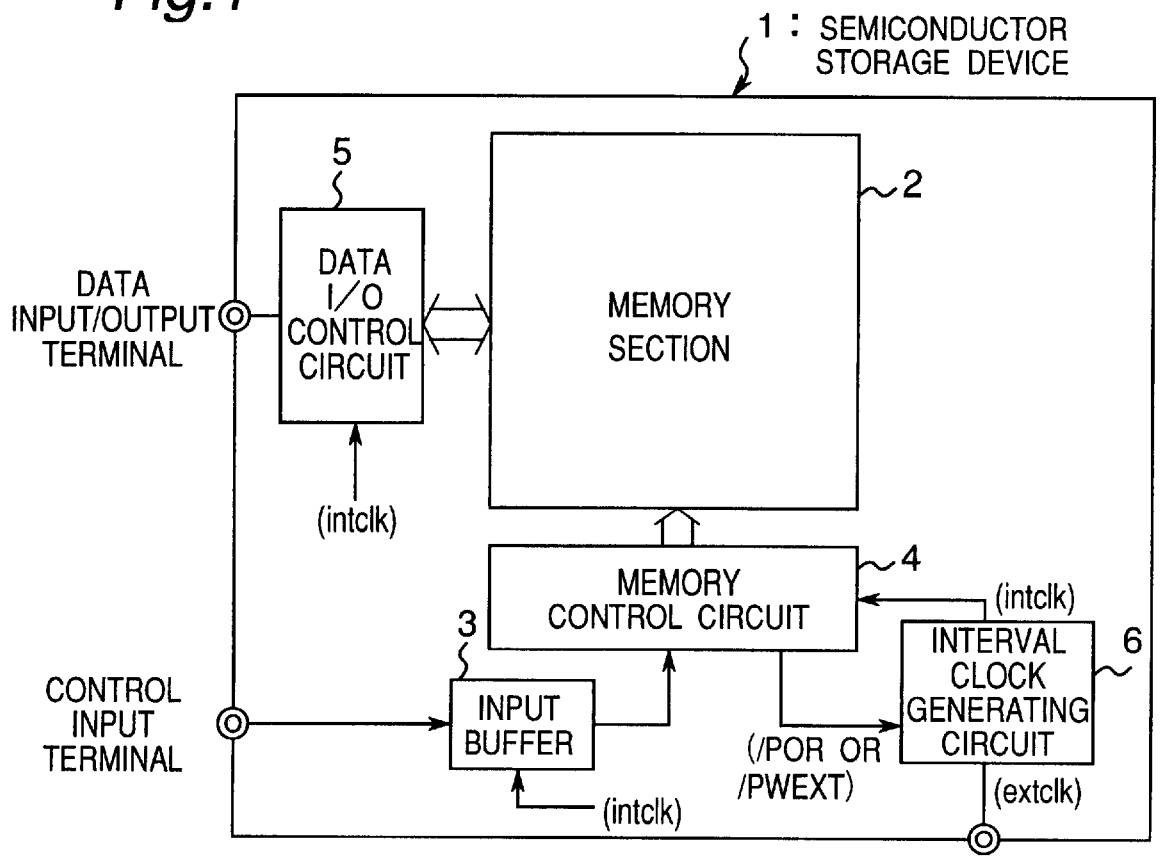
FIG. 1 is a schematic block diagram showing a clock-synchronized semiconductor storage device using an internal clock signal generator according to the present invention.

First of all, the operation of an internal clock signal generator in a semiconductor storage device will be briefly described with reference to FIG. 1. A semiconductor storage device 1 comprises a memory section 2 including a memory cell array for storing data, a memory control circuit 4 for controlling the operation of the memory section 2 in response to each control signal inputted from a control input terminal through an input buffer 3, a data I/O control circuit for controlling data output from the memory section 2 to a data input/output terminal and data input from the data input/output terminal to the memory section 2, and an internal clock signal generator 6.

Figure 3:
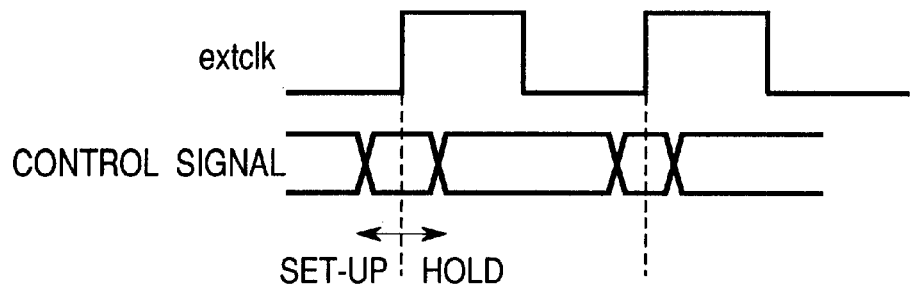
FIG. 3 is a diagram showing the relationship between a control signal and an external clock signal extclk in FIG. 1.

The internal clock signal generator 6 generates a predetermined internal clock signal intclk from an external clock signal extclk inputted from the outside, and outputs the internal clock signal intclk to the input buffer 3, the memory control circuit 4 and the data I/O control circuit 5, respectively. As shown in FIG. 3, the internal clock signal generator 6 generates and outputs the internal clock signal intclk to be matched with a spec for a set-up or hold time by adjusting the external clock signal extclk to the characteristic of the input buffer 3 in the semiconductor storage device 1 because the spec for the set-up or hold time is severe in the external clock signal extclk and data or a control signal.

Figure 2:
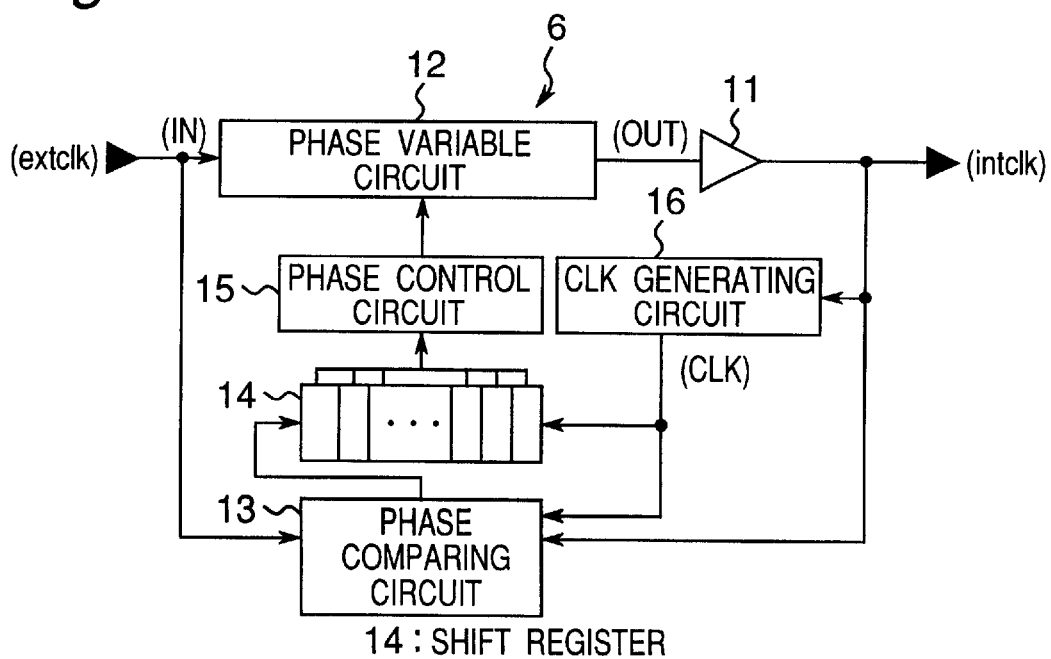
FIG. 2 is a schematic block diagram showing an internal clock signal generator according to a first embodiment of the present invention.

In FIG. 2, the internal clock signal generator 6 includes a phase variable circuit 12 for outputting, as an internal clock signal intclk through a buffer circuit 11, a signal generated by changing the phase of the clock signal extclk input from the outside, and a phase comparing circuit 13 for comparing the phase of the external clock signal extclk with that of the internal clock signal intclk and outputting the comparison result. Furthermore, the internal clock signal generator 6 includes a shift register 14 for temporarily storing the comparison result sent from the phase comparing circuit 13, a phase control circuit 15 for averaging a predetermined number of comparison results stored in the shift register 14 and outputting a phase control signal for adjusting the phase for the phase variable circuit 12 based on the average value, and a CLK generating circuit 16 for generating and outputting a predetermined clock signal CLK to the phase variable circuit 12, the phase comparing circuit 13 and the shift register 14 based on the internal clock signal intclk.

Figure 4:
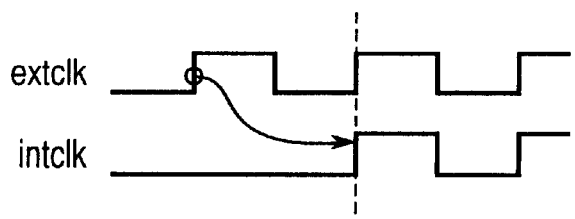
FIG. 4 is a diagram showing the relationship between the external clock signal extclk and an internal clock signal intclk.

In such internal clock signal generator 6, the phase variable circuit 12 outputs, as an internal clock signal intclk through the buffer circuit 11, a clock signal obtained by changing a phase in response to a phase control signal input from the phase control circuit 15 for the input external clock signal extclk. For example, the phase variable circuit 12 generates the internal clock signal intclk having a phase delayed by one cycle for the external clock signal extclk as shown in FIG. 4.

Figure 5:
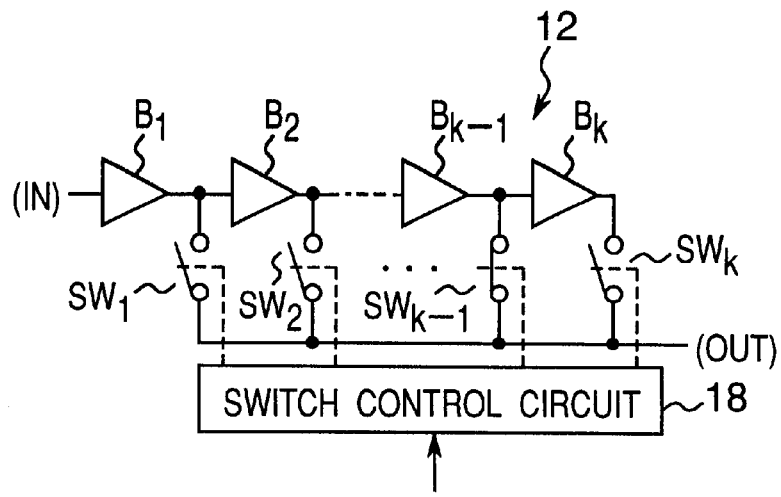
FIG. 5 is a diagram showing a phase variable circuit 12 in FIG. 2.

FIG. 5 is a schematic circuit diagram showing an example of the phase variable circuit 12. In FIG. 5, the phase variable circuit 12 includes k (k is a natural number greater than 1) buffer circuits $B_1$ to $B_k$ connected forward in series with each other, k switches $SW_1$ to $SW_k$ connected correspondingly between each of the outputs of the buffer circuits $B_1$ to $B_k$ and an output terminal OUT of the phase variable circuit 12, and a switch control circuit 18 for controlling the operation of each of the switches $SW_1$ to $SW_k$.

The switch control circuit 18 turns one of the switches $SW_1$ to $SW_k$ on, and connects the output of the buffer circuit corresponding to the switch to the output terminal OUT of the phase variable circuit 12 through the switch thus turned on. Thus, the phase of the external clock signal extclk is delayed by a delay time corresponding to the number of the buffer circuits connected between an input terminal IN of the phase variable circuit 12 and the output terminal OUT and a clock signal generated by the delay is outputted as the internal clock signal intclk through the buffer circuit 11.

On the other hand, the switch control circuit 18 inputs a control signal indicating whether the phase of a phase control signal sent from the phase control circuit 15 in a predetermined timing, for example, that of the internal clock signal intclk generated by the phase variable circuit 12 is delayed or advanced, and selects and turns on a switch adjacent to the turned-on switch in response to the phase control signal, thereby adjusting the phase of the internal clock signal intclk.

For example, when inputting the phase control signal for delaying the phase from the phase control circuit 15, the switch control circuit 18 exclusively turns on the switch adjacent to the turned-on switch such that the number of the buffer circuits connected in series between the input terminal IN of the phase variable circuit 12 and the output terminal OUT is increased by one. To the contrary, when inputting a phase control signal for advancing the phase from the phase control circuit 15, the switch control circuit 18 exclusively turns on the switch adjacent to the turned-on switch such that the number of the buffer circuits connected in series between the input terminal IN of the phase variable circuit 12 and the output terminal OUT is decreased by one.

The phase comparing circuit 13 compares the input external clock signal extclk with the internal clock signal intclk in a predetermined cycle in response to a clock signal CLK sent from a CLK generating circuit 16, and outputs the comparison result in binary data to the shift register 14. The shift register 14 is constituted by a plurality of registers $R_0$ to $R_n$ (n is a natural number greater than 1), and shifts a register in response to the clock signal CLK sent from the CLK generating circuit 16 and sequentially stores the comparison result input from the phase comparing circuit 13. It is preferable that the number of the registers of the shift register 14 should be five or more.

Figure 6:
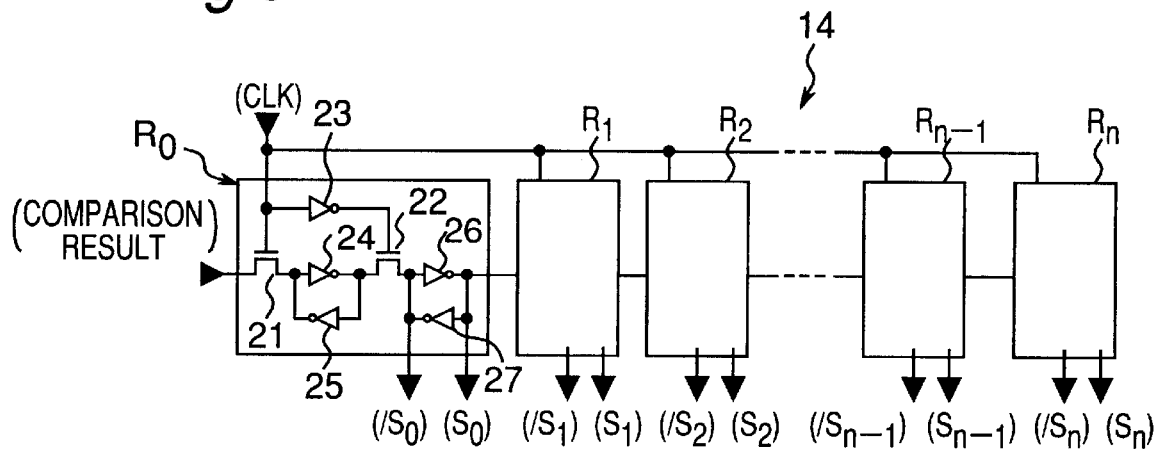
FIG. 6 is a diagram showing a shift register 14 in FIG. 2.

FIG. 6 is a schematic diagram showing an example of the circuit of the shift register 14. In FIG. 6, the shift register 14 is constituted by (n+1) registers $R_0$ to $R_n$ connected in series. Inverted signals $/S_0$ to $/S_n$ and non-inverted signals $S_0$ to $S_n$ for the stored data are output from the registers $R_0$ to $R_n$ to the phase control circuit 15, respectively. In FIG. 6, the registers $R_0$ to $R_n$ are equivalent to each other Therefore, only the register $R_0$ is shown in the example of the internal circuit, and description will be given to each of the registers $R_0$ to $R_n$ by taking the register $R_0$ as an example.

The register $R_0$ is formed by N channel MOS transistors (hereinafter referred to as NMOS transistors) 21 and 22 and inverter circuits 23 to 27. A clock signal CLK is input to the gate of the NMOS transistor 21, and an inverted signal of the clock signal CLK is input to the gate of the NMOS transistor 22. The inverter circuits 24 and 25 and the inverter circuits 26 and 27 form latch circuits, respectively.

The NMOS transistor 21 controls the input of data indicative of the comparison result sent from the phase comparing circuit 13 to the latch circuit formed by the inverter circuits 24 and 25 in response to the clock signal CLK. Moreover, the NMOS transistor 22 controls the connection of the two latch circuits in response to the inverted signal of the clock signal CLK. The non-inverted $S_0$ is output from the output terminal of the register $R_0$ and the inverted signal $/S_0$ is output from the connecting portion of the latch circuits of the inverter circuits 26 and 27 and the NMOS transistor 22. Thus, the results of comparison carried out past (n+1) times by the phase comparing circuit 13 are stored in the shift register 14.

Figure 7:
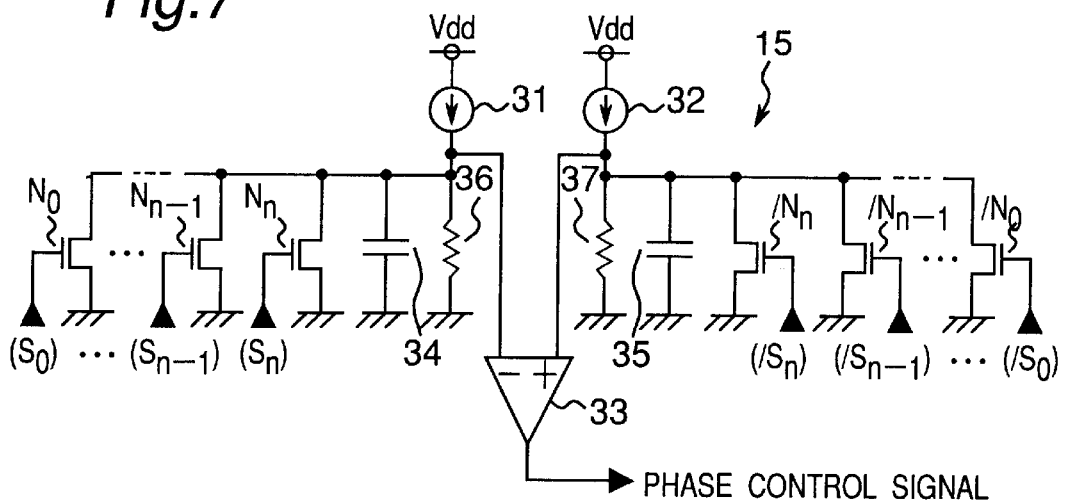
FIG. 7 is a diagram showing a phase control circuit 15 in FIG. 2.

FIG. 7 is a circuit diagram showing an example of the phase control circuit 15. In FIG. 7, the phase control circuit 15 includes (n+1) NMOS transistors $N_0$ to $N_n$, gates of which correspondingly input the non-inverted signals $S_0$ to $S_n$ output from the shift register 14, and (n+1) NMOS transistors $N_0$ to $N_n$, gates of which correspondingly input the inverted signals $/S_0$ to $/S_n$ output from the shift register 14. Furthermore, the phase control circuit 15 includes constant current sources 31 and 32, a differential amplifier 33 constituting a comparator, capacitors 34 and 35, and resistors 36 and 37.

Drains and sources of the NMOS transistors $N_0$ to $N_n$ and the capacitor 34 and the resistor 36 are connected between the inversion input terminal of the differential amplifier 33 and a ground. Similarly, drains and sources of the NMOS transistors $/N_0$ to $/N_n$ and the capacitor 35 and the resistor 37 are connected between the non-inversion input terminal of the differential amplifier 33 and the ground. Moreover, the constant current source 31 is connected to a DC power input terminal Vdd and the inversion input terminal of the differential amplifier 33, and the constant current source 32 is connected to the DC power input terminal Vdd and the non-inversion input terminal of the differential amplifier 33. A signal output from the differential amplifier 33 is input as a phase control signal to the switch control circuit 18 of the phase variable circuit 12.

In the NMOS transistors $N_0$ to $N_n$, the switch is turned on by the number of the non-inverted signals $S_0$ to $S_n$ which are input from the shift register 14 and have the High level. Similarly, in the NMOS transistors $/N_0$ to $/N_n$, the switch is turned on by the number of the inverted signals $/S_0$ to $/S_n$ which are input from the shift register 14 and have the High level. Consequently, the input voltage of each of the inversion input terminal and the non-inversion input terminal of the differential amplifier 33 is determined and the comparison result of the differential amplifier 33 is output to the phase variable circuit 12.

With such structure, for example, if there are more comparison results of the decision that the phase of the internal clock signal intclk is more advanced than that of the external clock signal extclk in the result of the comparison carried out by the phase comparing circuit 13 the past (n+1) times, the number of the non-inverted signals $S_0$ to $S_n$ of the shift register 14 which have the High level is increased, while the number of the inverted signals /$S_0$ to /$S_n$ of the shift register 14 which have the Low level is increased. Consequently, the electric potential of the inversion input germinal of the differential amplifier 33 in the phase control circuit 15 becomes lower than that of the non-inversion input terminal of the differential amplifier 33 and the output of the differential amplifier 33 has the High level.

The phase variable circuit 12 fetches the phase control signal from the phase control circuit 15 every (n+1) cycles of the clock signal CLK, that is, by setting, to one cycle, data storage from the register $R_0$ of the shift register 14 to the register $R_n$ in order. When inputting the phase control signal having the High level, the phase variable circuit 12 delays the phase of the internal clock signal intclk to be output. More specifically, the switch control circuit 18 in the phase variable circuit 12 exclusively turns on the switch connected to the output terminal of the inverter circuit having an input terminal to which the turned-on switch is connected such that the number of the inverter circuits connected in series between the input terminal IN of the phase variable circuit 12 and the output terminal OUT is increased by one.

Thus, the internal clock signal generator according to the first embodiment stores, in the shift register 14, the binary result of comparison carried out by the phase comparing circuit 13 the past (n+1) times which indicates whether the phase is advanced or delayed, the phase control circuit 15 outputs, as a phase control signal to the phase variable circuit 12, more results of the comparison carried out the (n+1) times, and the phase variable circuit 12 adjusts the phase of the internal clock signal intclk based on the input phase control signal. Consequently, the phase comparison resolution of the phase comparing circuit is reduced due to a fluctuation in the power source or the like, and it is possible to prevent an oscillation from being generated when the phase comparing circuit malfunctions.

Second Embodiment

In the following second embodiment, the number of samples of a comparison result obtained by a phase comparing circuit 13 is reduced to increase the speed for phase adjustment through a phase variable circuit 12 for a predetermined period immediately after a return from a power down mode in which a consumed current is reduced in a semiconductor storage device comprising an internal clock signal generator to a normal operation mode or for a predetermined period after a power source is turned-on. The second embodiment will be described below in detail. In a schematic block diagram showing the internal clock signal generator according to the second embodiment, the phase control circuit 15 shown in FIG. 2 is indicated as a phase control circuit 41 and the internal clock signal generator 6 shown in FIG. 2 is indicated as an internal clock signal generator 40, and other circuit portions are the same as those in FIG. 2 and will be therefore omitted.

In the semiconductor storage device comprising the internal clock signal generator, a phase difference between an external clock signal extclk and an internal clock signal intclk is great when the power source is turned on. For this reason, the phase control circuit 41 of the internal clock signal generator 40 according to the second embodiment serves to decide the state of the phase of the internal clock signal intclk with the smaller number of samples of the comparison result than the ordinary number for a predetermined period after the power source is turned on.

In the internal clock signal generator according to the second embodiment, only the phase control circuit of the internal clock signal generator 6 according to the first embodiment is different. Therefore, the phase control circuit according to the second embodiment will be described below.

Figure 8:
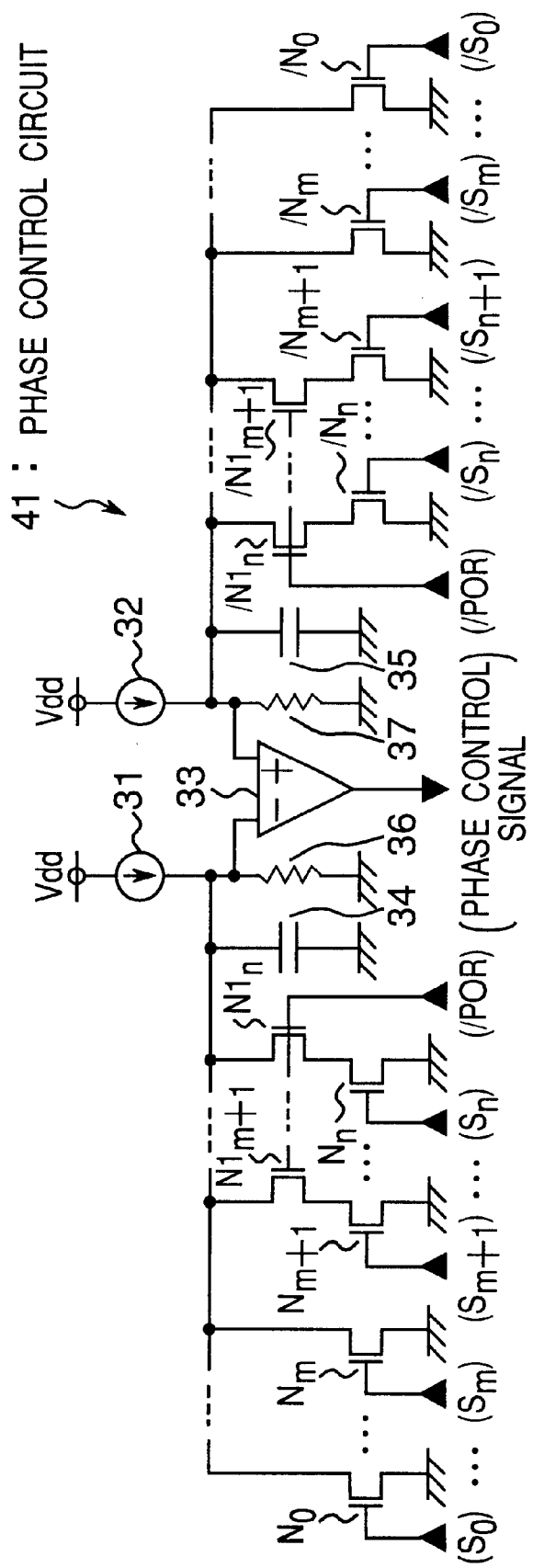
FIG. 8 is a circuit diagram showing a phase control circuit in an internal clock signal generator according to a second embodiment of the present invention.

FIG. 8 is a circuit diagram showing an example of the phase control circuit in the internal clock signal generator according to the second embodiment of the present invention. In FIG. 8, the same portions as those of FIG. 7 have the same reference numerals and their description will be omitted, and only a difference between FIGS. 7 and 8 will be described below.

FIG. 8 is different from FIG. 7 in that drains and sources of NMOS transistors $N1_{m+1}$ to $N_n$ are connected between drains of corresponding NMOS transistors $N_{m+1}$ to $N_n$ and the inversion input terminal of the differential amplifier 33, and similarly, the drains and sources of NMOS transistors /$N1_{m+1}$ to /$N1_n$ are connected between drains of corresponding NMOS transistors /$N_{m+1}$ to /$N_n$ and the non-inversion input terminal of the differential amplifier 33 and the phase control circuit 15 shown in FIG. 7 is correspondingly indicated as the phase control circuit 41. The m is a natural number of greater than 0, but smaller than n.

In FIG. 8, the phase control circuit 41 includes NMOS transistors $N_0$ to $N_n$ and /$N_0$ to /$N_n$, and NMOS transistors $N1_{m+1}$ to $N1_n$ and /$N1_{m+1}$ to /$N1_n$, gates of which input a power on signal /POR generated in a circuit for monitoring power on (for example, the memory control circuit 4 in FIG. 1) and set to have the Low level for a predetermined period after the power source is turned on. Furthermore, the phase control circuit 41 includes constant current sources 31 and 32, a differential amplifier 33, capacitors 34 and 35, and resistors 36 and 37.

Drains and sources of the NMOS transistors $N_0$ to $N_m$ are connected between the inversion input terminal of the differential amplifier 33 and a ground, and the capacitor 34 and the resistor 36 are connected to each other. Similarly, the drains and sources of the NMOS transistors /$N_0$ to /$N_m$ are connected between the non-inversion input terminal of the differential amplifier 33 and the ground, and the capacitor 35 and the resistor 37 are connected to each other.

Furthermore, the drains and the sources of the NMOS transistors $N_{m+1}$ to $N_n$ are correspondingly connected between the inversion input terminal of the differential amplifier 33 and the drains of the NMOS transistors $N1_{m+1}$ to $N_n$. Similarly, the drains and the sources of the NMOS transistors /$N1_{m+1}$ to /$N_n$ are correspondingly connected between the non-inversion input terminal of the differential amplifier 33 and the drains of the NMOS transistors /$N_{m+1}$ to /$N_n$. Each of the sources of the NMOS transistors $N_{m+1}$ to $N_n$ and /$N_{m+1}$ to /$N_n$ is grounded and the power on signal /POR is input to each of the gates of the NMOS transistors $N1_{m+1}$ to $N1_n$ and /$N1_{m+1}$ to /$N1_n$.

Figure 9:
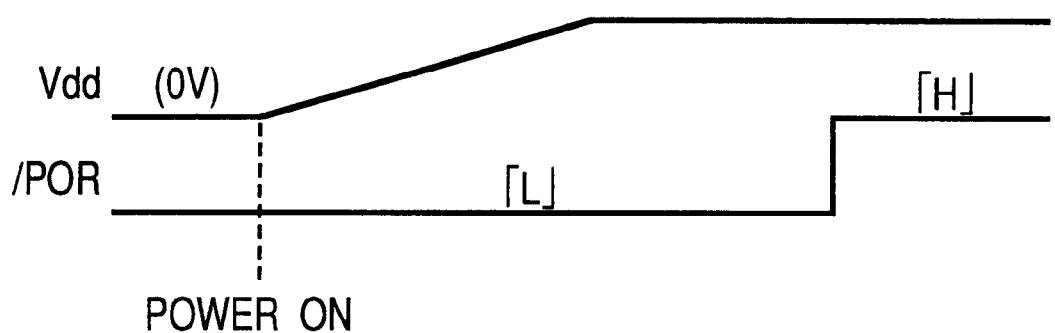
FIG. 9 is a diagram showing a power on signal/POR.

With such structure, the power on signal /POR has the Low level for a predetermined period after the power source is turned-on and then rises to have the High level as shown in FIG. 9. In the phase control circuit 41, when the power on signal /POR has the Low level, the NMOS transistors $N1_{m+1}$ to $N1_n$ and /$N1_{m+1}$ to /$N1_n$ is turned off and the comparison results stored in registers $R_{m+1}$ to $R_n$ of the shift register 14 are not reflected on the electric potential of each input terminal of the differential amplifier 33. More specifically, when the power on signal /POR has the Low level, the phase control circuit 41 decides the state of the phase of the internal clock signal intclk and outputs a phase control signal corresponding to the result of the decision to the phase variable circuit 12 by using only the comparison results stored in the registers $R_0$ to $R_m$.

In the same manner as the operation to be performed when the power source is turned-on, a great phase difference is made between the external clock signal extclk and the internal clock signal intclk immediately after a return from a power down mode in which a consumed current is reduced in the semiconductor storage device comprising the internal clock signal generator to a normal operation mode. Consequently, it is also possible to use, in place of the power on signal /POR, a return signal /PWEXT which is generated in a circuit for monitoring the switching of an operation mode from the power down mode in which the consumed current is reduced in the semiconductor storage device to the normal operation mode (for example, the memory control circuit 4 in FIG. 1) and is set to have the Low level for a predetermined period after the return from the power down mode to the normal operation mode.

Figure 10:
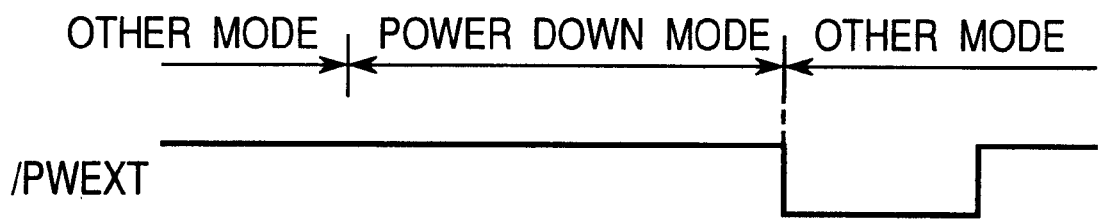
FIG. 10 is a diagram showing a return signal/PWEXT.

In this case, the return signal IPWEXT is set to have the Low level for a predetermined period after the return from the power down mode to the normal operation mode and then rises to have the High level as shown in FIG. 10. In the case in which the return signal IPWEXT is used, the operation of the phase control circuit 41 is the same as the operation to be carried out by using the power on signal /POR and description thereof will be omitted.

Thus, the internal clock signal generator according to the second embodiment decides the state of the phase of the internal clock signal intclk and outputs a phase control signal corresponding to the result of the decision to the phase variable circuit 12 by using only the results of comparison stored in the registers $R_0$ to $R_m$ for a predetermined period after the power source is turned-on or a predetermined period immediately after the return from the power down mode in which the consumed current is reduced in the semiconductor storage device to the normal operation mode.

Consequently, the same effects as those of the first embodiment can be obtained. In addition, in the case in which the phase difference between the external clock, signal extclk and the internal clock signal intclk is great after the power source is turned-on or immediately after the return from the power down mode to the normal operation mode, the speed of the phase adjustment carried out by the phase variable circuit 12 can be increased by decreasing the number of samples of the results of the comparison of the phase of the external clock signal extclk and that of the internal clock signal intclk. Thus, the internal clock signal intclk can be stabilized in the early stage.

Third Embodiment

In the second embodiment, a power on signal /POR or a return signal /PWEXT sent from other circuits is used to detect the state in which the phase difference between the internal clock signal intclk and the external clock signal extclk is great. In a third embodiment to be described below in detail, when a potential difference between the input terminals of a differential amplifier 33 in a phase control circuit 41 is great, it may be decided that the phase difference between the internal clock signal intclk and the external clock signal extclk is great, thereby decreasing the number of samples of the result of comparison.

In a schematic block diagram showing an example of an internal clock signal generator according to the third embodiment, the phase control circuit 15 shown in FIG. 2 is indicated as a phase control circuit 51 and the internal clock signal generator 6 shown in FIG. 2 is indicated as an internal clock signal generator 50, and other portions are the same as those in FIG. 2 and will be therefore omitted.

In the case in which the phase of the external clock signal extclk is greatly different from that of the internal clock signal intclk, the potential difference between the input terminals of the differential amplifier 33 is increased. Consequently, the phase control circuit 51 of the internal clock signal generator 50 according to the third embodiment decides the state of the phase of the internal clock signal intclk with the smaller number of samples of the comparison result than the ordinary number when the potential difference between the input terminals of the differential amplifier 33 exceeds a predetermined value ΔV.

In the internal clock signal generator according to the third embodiment, thus, only the phase control circuit of the internal clock signal generator 6 according to the first embodiment is different. Therefore, the phase control circuit according to the third embodiment will be described below.

Figure 11:
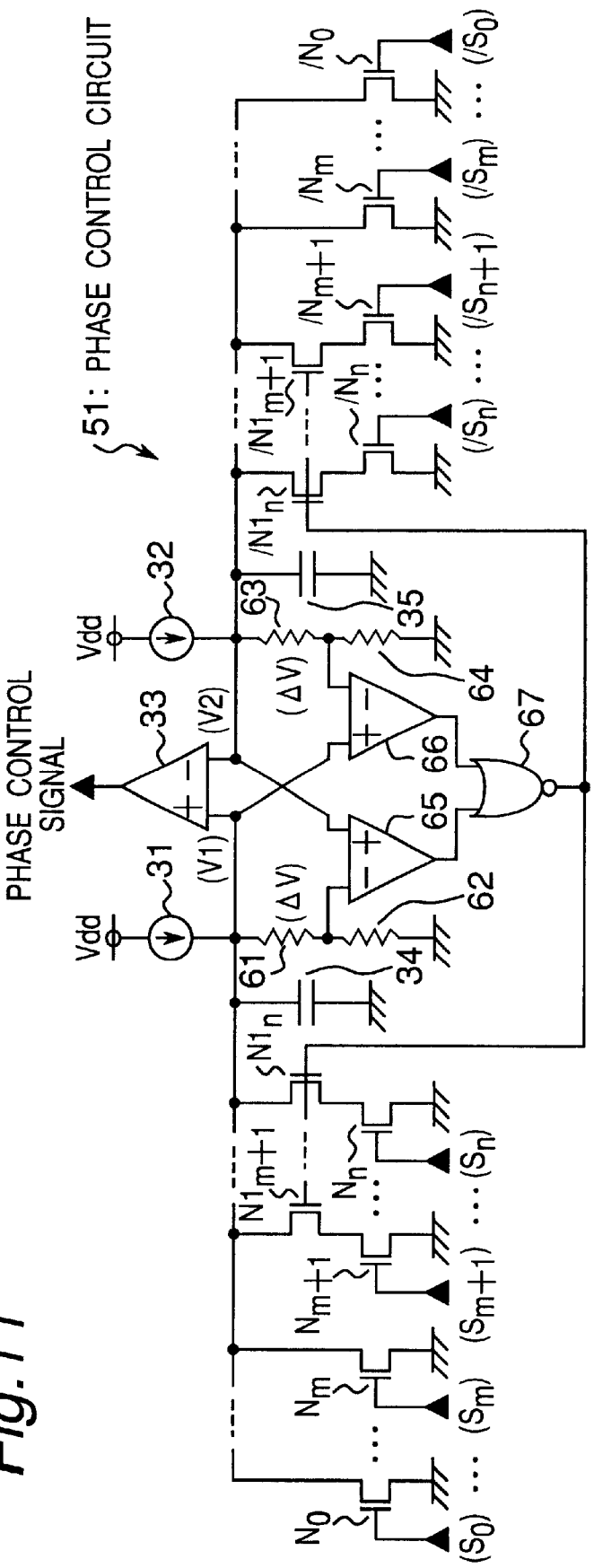
FIG. 11 is a circuit diagram showing a phase control circuit in an internal clock signal generator according to a third embodiment of the present invention.
Figure 12:
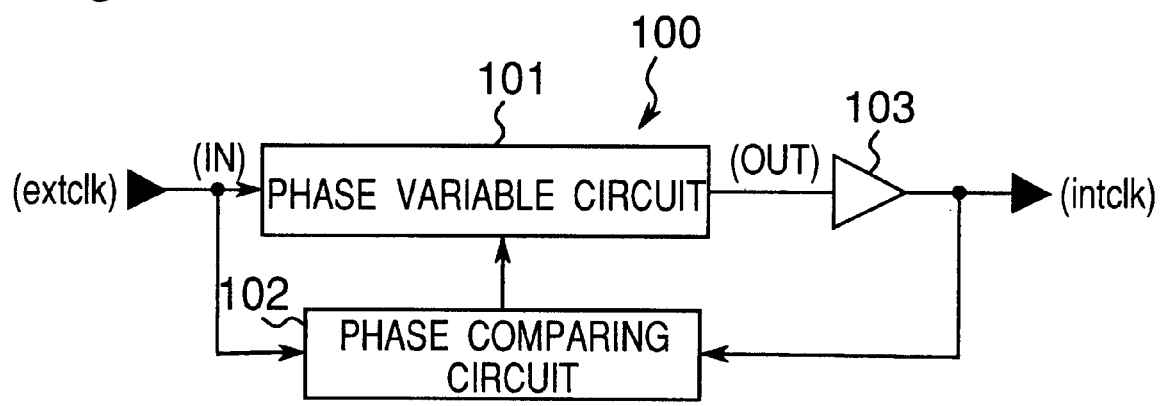
FIG. 12 is a schematic block diagram showing an internal clock signal generator in a conventional clock-synchronized semiconductor storage device.
Figure 13:
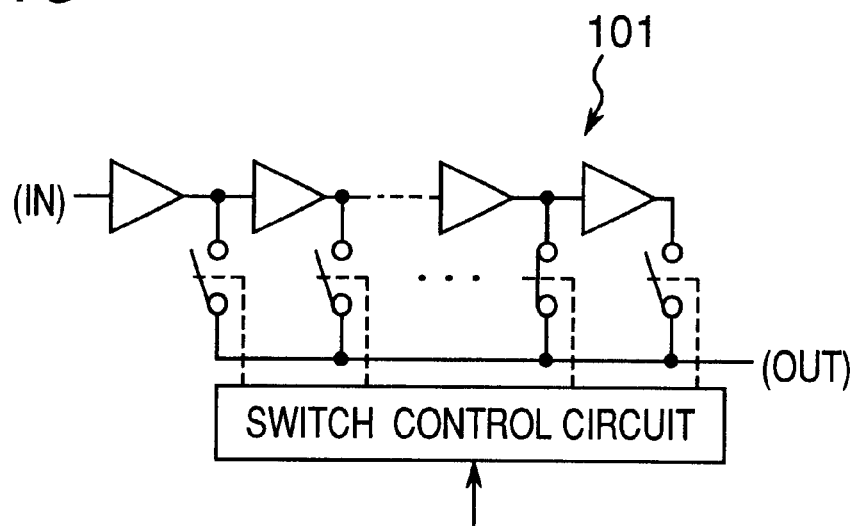
FIG. 13 is a diagram showing a phase variable circuit 101 in FIG. 12.

FIG. 11 is a circuit diagram showing an example of the phase control circuit in the internal clock signal generator according to the third embodiment of the present invention. In FIG. 11, the same portions as those of FIG. 8 have the same reference numerals and their description will be omitted, and only a difference between FIGS. 8 and 11 will be described below.

FIG. 11 is different from FIG. 8 in that a series circuit of a resistor 61 and a resistor 62 is connected in place of the resistor 36 shown in FIG. 8, a series circuit of a resistor 63 and a resistor 64 is connected in place of the resistor 37 shown in FIG. 8, differential amplifiers 65 and 66 constituting comparators and a NOR circuit 67 are added, each of the gates of NMOS transistors $N1_{m+1}$ to $N1_n$ and $/N1_{m+1}$ to $/N1_n$ is connected to the output terminal of the NOR circuit 67, and a phase control circuit 51 is correspondingly used in place of the phase control circuit 41 shown in FIG. 8.

In FIG. 11, the series circuit of the resistor 61 and the resistor 62 is connected between the non-inversion input terminal of the differential amplifier 33 and a ground, and similarly, the series circuit of the resistor 63 and the resistor 64 is connected between the inversion input terminal of the differential amplifier 33 and the ground. The connecting portion of the resistor 61 and the resistor 62 is connected to the inversion input terminal of the differential amplifier 65, the connecting portion of the resistor 63 and the resistor 64 is connected to the inversion input terminal of the differential amplifier 66, and the resistance values of the resistors 61 to 64 are set such that voltage drops caused by the resistor 61 and the resistor 63 are set to be a predetermined voltage ΔV, respectively.

Moreover, the inversion input terminal of the differential amplifier 33 is connected to the non-inversion input terminal of the differential amplifier 65, and the non-inversion input terminal of the differential amplifier 33 is connected to the non-inversion input terminal of the differential amplifier 66. Furthermore, the output terminals of the differential amplifiers 65 and 66 are correspondingly connected to the input terminals of the NOR circuit 67, and the output terminal of the NOR circuit 67 is connected to each of the gates of the NMOS transistors $N1_{m+1}$ to $N1_n$ and $/N1_{m+1}$ to $/N1_n$.

With such structure, if the phase of the external clock signal extclk is greatly different from that of the internal clock signal intclk in the phase control circuit 51, the results of comparison obtained by a phase comparing circuit 13 and stored in a shift register 14 is greatly biased toward either of sides and the potential difference between the input terminals of the differential amplifier 33 is increased. If the voltage of the non-inversion input terminal of the differential amplifier 33 is represented as Vi and the voltage of the inversion input terminal of the differential amplifier 33 is represented as V2, the output terminal of the differential amplifier 65 has the High level with (V2−V1)>ΔV and the output terminal of the differential amplifier 66 has the High level with (V1−V2)>ΔV.

More specifically, when the voltage difference between the input terminals of the differential amplifier 33 exceeds ΔV, the output terminal of the NOR circuit 67 has the Low level and all the NMOS transistors $N1_{m+1}$ to $N1_n$ and $/N1_{m+1}$ to $/N1_n$ are turned off. Consequently, the comparison results stored in registers $R_{m+1}$ to $R_n$ of the shift register 14 are not reflected on the electric potential of each input terminal of the differential amplifier 33. In the same manner as the case in which the power on signal /POR of the phase control circuit 41 shown in FIG. 8 has the Low level, the phase control circuit 51 decides the state of the phase of the internal clock signal intclk and outputs a phase control signal corresponding to the result of the decision to the phase variable circuit 12 by using only the comparison results stored in the registers $R_0$ to $R_m$.

Thus, the internal clock signal generator according to the third embodiment detects the state in which the phase difference between the internal clock signal intclk and the external clock signal extclk is great in the phase control circuit 51, the phase control circuit 51 decides the state of the phase of the internal clock signal intclk by using only the results of comparison stored in the registers $R_0$ to $R_m$ when detecting the above-mentioned state, and outputs a phase control signal corresponding to the result of the decision to the phase variable circuit 12. Consequently, the same effects as those of the second embodiment can be obtained and it is not necessary to detect, through other circuits, the state in which the phase difference between the internal clock signal intclk and the external clock signal extclk is great, the unexpected unstable state of the internal clock signal intclk can be detected on the inside, and the internal clock signal intclk can be stabilized more quickly.

Although the present invention has been described in connection with the preferred embodiments thereof with reference to the accompanying drawings, it is to be noted that various changes and modifications are apparent to those skilled in the art. By way of example, there has been described the case in which the clock signal CLK is generated by the CLK generating circuit 16 based on the internal clock signal intclk in the first to third embodiments, the internal clock signal intclk or the external clock signal extclk may be used as the clock signal CLK.

Accordingly, such changes and modifications are to be understood as included within the scope of the present invention as defined by the appended claims, unless they depart therefrom.

What is claimed is:

1. An internal clock signal generating circuit for generating an internal clock signal based on an external clock signal, comprising:

a phase comparing section for comparing phases of the external clock signal and the generated internal clock signal and outputting a comparison result indicating whether the phase of the internal clock signal is advanced or delayed in relation to the external clock signal;

a comparison result storing section for sequentially storing the comparison result;

a phase deciding section for generating a phase control signal indicative of a phase state based on a predetermined number of the comparison results; and a phase variable section for adjusting the phase of the generated internal clock signal according to the phase control signal;

wherein the predetermined number of the comparison results used for generating the phase control signal is reduced in response to an occurrence of a predetermined event.

2. The internal clock signal generating circuit according to claim 1, wherein the predetermined number of the comparison results used for generating the phase control signal is reduced when a phase difference between the external clock signal and the internal clock signal exceeds a predetermined value.

3. The internal clock signal generating circuit according to claim 2, wherein the predetermined number of the comparison results used for generating the phase control signal is reduced for a predetermined period in which the phase difference between the external clock signal and the internal clock signal exceeds the predetermined value.

4. The internal clock signal generating circuit according to claim 1, wherein the predetermined number of the comparison results used for generating the phase control signal is reduced for a predetermined time in response to a power on signal indicating that power is being supplied to the circuit.

5. The internal clock signal generating circuit according to claim 1, wherein the predetermined number of the comparison results used for generating the phase control signal is reduced for a predetermined period of time in response to a return signal indicating that the circuit returns from a low consumed current operation mode to a normal operation mode.

6. The internal clock signal generating circuit according to claim 1, wherein the phase deciding section generates the phase control signal based on a first indication signal and a second indication signal, the first indication signal represents the number of the comparison results that the internal clock signal leads the external clock signal within a predetermined number of cycles, and the second indication signal represents the number of the comparison results that the internal clock signal lags behind the external clock signal during the predetermined number of cycles;

wherein the predetermined number of the comparison results used for generating the phase control signal is reduced in response to a difference between the signal levels of the first indication signal and the second indication signal exceeding a predetermined level.

7. A method for adaptively synchronizing clock signals, comprising the steps of:

comparing phases of a clock signal and a reference clock signal;

indicating a comparison result of the comparing step as a lead or a lag by the clock signal in relation to the reference clock signal; and shifting the phase of the clock signal based on a predetermined number of the comparison results;

wherein the predetermined number of the comparison results used in shifting the phase of the clock signal is reduced in response to an occurrence of a predetermined event.

8. The method according to claim 7, wherein the predetermined number of the comparison results used in the shifting step is reduced in response to a phase difference between the reference clock signal and the clock signal exceeding a predetermined level.

9. The method according to claim 7, wherein the predetermined number of the comparison results used in the shifting step is reduced in response to power being supplied to a circuit generating the clock signal.

10. The method according to claim 7, wherein the predetermined number of the comparison results used in the shifting step is reduced in response to the difference between the number of the comparison results having a lead and having a lag exceeding a predetermined level.

* * * * *